United States Patent
Yang et al.

(10) Patent No.: US 11,618,949 B2
(45) Date of Patent: Apr. 4, 2023

(54) METHODS TO REDUCE MATERIAL SURFACE ROUGHNESS

(71) Applicant: Applied Materials, Inc., Santa Clara, CA (US)

(72) Inventors: Yi Yang, San Jose, CA (US); Krishna Nittala, San Jose, CA (US); Karthik Janakiraman, San Jose, CA (US); Aykut Aydin, Sunnyvale, CA (US); Diwakar Kedlaya, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 67 days.

(21) Appl. No.: 17/087,346

(22) Filed: Nov. 2, 2020

(65) Prior Publication Data
US 2021/0140045 A1 May 13, 2021

Related U.S. Application Data

(60) Provisional application No. 62/933,012, filed on Nov. 8, 2019.

(51) Int. Cl.
*C23C 16/38* (2006.01)
*C23C 16/455* (2006.01)
(Continued)

(52) U.S. Cl.
CPC ...... *C23C 16/45536* (2013.01); *C23C 16/303* (2013.01); *C23C 16/38* (2013.01); *H01J 37/32009* (2013.01)

(58) Field of Classification Search
CPC .............. C23C 16/303; C23C 16/38; C23C 16/45536
See application file for complete search history.

(56) References Cited

U.S. PATENT DOCUMENTS 6,391,803 B1 * 5/2002 Kim ................ C23C 16/45534
427/255.393
6,410,090 B1 6/2002 Wang
6,500,771 B1 12/2002 Vassiliev et al.
(Continued)

FOREIGN PATENT DOCUMENTS

JP 3-276723 * 12/1991 ........... H01L 21/316
JP 2013-45822 * 3/2013 ........... H01L 21/205
(Continued)

OTHER PUBLICATIONS

Shigeta, Masaya, et al., "Multi-componentco-condensation model of Ti-based boride/silicide nanoparticle growth in induction thermal plasmas". Thin Solid Films 515 (2007) 4217-4227.*
(Continued)

*Primary Examiner* — Bret P Chen
(74) *Attorney, Agent, or Firm* — Kilpatrick Townsend & Stockton LLP

(57) ABSTRACT

Exemplary deposition methods may include delivering a silicon-containing precursor and a boron-containing precursor to a processing region of a semiconductor processing chamber. The methods may include providing a hydrogen-containing precursor with the silicon-containing precursor and the boron-containing precursor. A flow rate ratio of the hydrogen-containing precursor to either of the silicon-containing precursor or the boron-containing precursor is greater than or about 2:1. The methods may include forming a plasma of all precursors within the processing region of a semiconductor processing chamber. The methods may include depositing a silicon-and-boron material on a substrate disposed within the processing region of the semiconductor processing chamber.

20 Claims, 3 Drawing Sheets

(51) Int. Cl.
  *H01J 37/32* (2006.01)
  *C23C 16/30* (2006.01)

(56) References Cited

U.S. PATENT DOCUMENTS

| | | | | |
|---|---|---|---|---|
| 7,501,343 | B2* | 3/2009 | Byun | C23C 16/38 |
| | | | | 257/E21.168 |
| 7,633,125 | B2 | 12/2009 | Lu et al. | |
| 8,329,599 | B2* | 12/2012 | Fukazawa | H01L 21/02274 |
| | | | | 438/794 |
| 8,563,090 | B2* | 10/2013 | Balseanu | C23C 16/0272 |
| | | | | 427/419.1 |
| 8,846,525 | B2* | 9/2014 | Rangarajan | C23C 16/30 |
| | | | | 257/E21.16 |
| 9,929,005 | B1* | 3/2018 | Shimamoto | H01L 21/02323 |
| 10,340,134 | B2* | 7/2019 | Hirose | C23C 16/30 |
| 2010/0098884 | A1* | 4/2010 | Balseanu | C23C 16/342 |
| | | | | 427/579 |
| 2015/0107582 | A1* | 4/2015 | Jin | G02B 5/208 |
| | | | | 428/206 |
| 2016/0254136 | A1* | 9/2016 | Sato | H01L 21/02274 |
| | | | | 438/782 |
| 2016/0293410 | A1* | 10/2016 | Lei | H01L 29/16 |
| 2018/0233357 | A1 | 8/2018 | Kabansky et al. | |
| 2019/0055643 | A1* | 2/2019 | Longrie | C23C 16/4405 |
| 2019/0326110 | A1* | 10/2019 | Gadre | H01L 21/0217 |
| 2020/0211834 | A1* | 7/2020 | Yang | C23C 16/0209 |

FOREIGN PATENT DOCUMENTS

| | | |
|---|---|---|
| TW | I553146 B | 10/2016 |
| TW | 2018-23159 A | 7/2018 |

OTHER PUBLICATIONS

Shim, Seung Hwan, et al., "Thermoelectric characteristics of the spark plasma-sintered silicon boride ceramics". Journal of the Korean Crystal Growth and Crystal Technology, vol. 15, No. 2 (2005) 75-78.*

Chen, Lidong, et al., "Synthesis and Thermoelectric Properties of Boron-rich Silicon Borides". Materials Transactions, JIM, vol. 37, No. 5 (1996) pp. 1182-1185.*

Tului, Mario, et al., "Silicon carbide based plasma sprayed coatings". Surface and Coatings Technology, vol. 207, Aug. 25, 2012, pp. 182-189.*

Cogan, Stuart F., et al., "Plasma-enhanced chemical vapor deposited silicon carbide as an implantable dielectric coating". J Biomed Mater Res A. Dec. 1, 2003; 67(3):856-67. doi: 10.1002/jbm.a.10152. PMID: 14613234.*

Voronkov, Vladimir V., et al., "Modelling plasma-induced hydrogen profiles in boron-doped and near-intrinsic silicon". Phys. Status Solidi A 214, No. 7, (2017) 1700287, pp. 1-6.*

Torres, A., et al., "Thermo-sensing silicon-germanium-boron films prepared by plasma for un-cooled micro-bolometers". Journal of Non-Crystalline Solids article 354 (2008) 2556-2560.*

Tsai, C.C., et al., "Characterization of amorphous semiconducting silicon-boron alloys prepared by plasma decomposition". Physical Review B, vol. 19, No. 4, Feb. 15, 1979, pp. 2041-2055.*

International Search Report and Written Opinion dated Mar. 2, 2021 in International Patent Application No. PCT/US2020/058585, 6 pages.

Application No. PCT/US2020/058585, International Preliminary Report on Patentability, dated May 19, 2022, 5 pages.

* cited by examiner

METHODS TO REDUCE MATERIAL SURFACE ROUGHNESS

CROSS REFERENCES TO RELATED APPLICATIONS

This application claims the benefit of priority to U.S. Patent Application No. 62/933,012 filed Nov. 8, 2019, the contents of which are hereby incorporated by reference in their entirety for all purposes.

TECHNICAL FIELD

The present technology relates to semiconductor deposition processes. More specifically, the present technology relates to methods of depositing materials with reduced surface roughness.

BACKGROUND

Integrated circuits are made possible by processes which produce intricately patterned material layers on substrate surfaces. Producing patterned material on a substrate requires controlled methods of formation and removal of exposed material. As device sizes continue to shrink, material uniformity may affect subsequent operations. For example, surface roughness of masking materials may affect subsequent etching uniformity.

Thus, there is a need for improved systems and methods that can be used to produce high quality devices and structures. These and other needs are addressed by the present technology.

SUMMARY

Exemplary deposition methods may include delivering a silicon-containing precursor and a boron-containing precursor to a processing region of a semiconductor processing chamber. The methods may include providing a hydrogen-containing precursor with the silicon-containing precursor and the boron-containing precursor. A flow rate ratio of the hydrogen-containing precursor to either of the silicon-containing precursor or the boron-containing precursor may be greater than or about 2:1. The methods may include forming a plasma of all precursors within the processing region of a semiconductor processing chamber. The methods may include depositing a silicon-and-boron material on a substrate disposed within the processing region of the semiconductor processing chamber.

In some embodiments, the silicon-and-boron material may be characterized by an as-deposited surface roughness of less than or about 2 nm. A plasma power density may be maintained at greater than or about 0.5 W/cm$^2$ during the forming the plasma of all precursors within the processing region of a semiconductor processing chamber. A substrate temperature may be maintained above or about 400° C. during the depositing the silicon-and-boron material on the substrate. A pressure may be maintained below or about 10 Torr during the depositing the silicon-and-boron material on the substrate. The methods may include providing an argon precursor with the silicon-containing precursor and the boron-containing precursor. The methods may include, subsequent the depositing, performing a thermal anneal of the silicon-and-boron material. The silicon-containing precursor may be or include silane, and the boron-containing precursor may be or include diborane.

Some embodiments of the present technology may encompass deposition methods. The methods may include delivering a silicon-containing precursor and a boron-containing precursor to a processing region of a semiconductor processing chamber. The methods may include forming a plasma of the silicon-containing precursor and the boron-containing precursor within the processing region of a semiconductor processing chamber. The methods may include depositing a silicon-and-boron material on a substrate disposed within the processing region of the semiconductor processing chamber. The silicon-and-boron material may be characterized by an as-deposited surface roughness of less than or about 1.5 nm.

In some embodiments, the methods may include providing a hydrogen-containing precursor with the silicon-containing precursor and the boron-containing precursor. A flow rate ratio of the hydrogen-containing precursor to either of the silicon-containing precursor or the boron-containing precursor may be greater than or about 2:1. The methods may include providing an argon precursor with the silicon-containing precursor and the boron-containing precursor. A flow rate ratio of the argon precursor to the hydrogen-containing precursor may be less than or about 1:1. The methods may include, subsequent the depositing, thermally annealing the silicon-and-boron material for a first period of time. The substrate may be maintained at a first temperature during the depositing. The substrate may be maintained at a second temperature while thermally annealing the silicon-and-boron material, and the second temperature may be greater than the first temperature. The second temperature may be greater than or about 500° C. A plasma power may be maintained at greater than or about 2.0 kW while forming the plasma of the silicon-containing precursor and the boron-containing precursor within the processing region of a semiconductor processing chamber.

Some embodiments of the present technology may encompass deposition methods. The methods may include delivering a silicon-containing precursor and a boron-containing precursor to a processing region of a semiconductor processing chamber. The methods may include forming a plasma of all precursors within the processing region of a semiconductor processing chamber. A plasma power may be maintained at greater than or about 1.0 kW during the forming the plasma of all precursors within the processing region of a semiconductor processing chamber. The methods may include depositing a silicon-and-boron material on a substrate disposed within the processing region of the semiconductor processing chamber.

In some embodiments, the methods may include providing a hydrogen-containing precursor with the silicon-containing precursor and the boron-containing precursor. A flow rate ratio of the hydrogen-containing precursor to either of the silicon-containing precursor or the boron-containing precursor may be greater than or about 2:1. The methods may include providing an argon precursor with the silicon-containing precursor and the boron-containing precursor. A flow rate ratio of the argon precursor to the hydrogen-containing precursor may be less than or about 1:1. The methods may include, subsequent the depositing, performing a thermal anneal of the silicon-and-boron material for a first period of time. The substrate may be maintained at a first temperature during the depositing. The substrate may be maintained at a second temperature during the thermal anneal of the silicon-and-boron material, and the second temperature may be greater than the first temperature.

Such technology may provide numerous benefits over conventional systems and techniques. For example, the processes may produce films characterized by reduced surface roughness. Additionally, the operations of embodiments of the present technology may produce improved mask materials that may facilitate processing operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor fabrication, structures may be produced on a substrate utilizing a variety of deposition and etching operations. Mask materials may be used to allow materials to be partially etched, or etched to produce features across the substrate. As device sizes continue to reduce, and improved selectivity between materials may ease structural formation, utilizing improved hard masks may facilitate fabrication. For example, compared to a thermally produced amorphous silicon hard masks, a silicon film incorporating boron may be characterized by improved hardness and other material properties, facilitating the film use as a mask material. However, while thermally produced silicon may be characterized by a substantially smooth surface, boron-incorporated silicon films may be characterized by increased surface roughness.

The present technology may overcome these limitations by adjusting deposition parameters and materials to perform a surface treatment during the deposition. For example, the present technology may include etching exposed features of the film layer during deposition. This may facilitate a more uniform surface profile, which may reduce or limit surface roughness during deposition. After describing general aspects of a chamber according to embodiments of the present technology in which plasma processing operations discussed below may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

Figure 1:
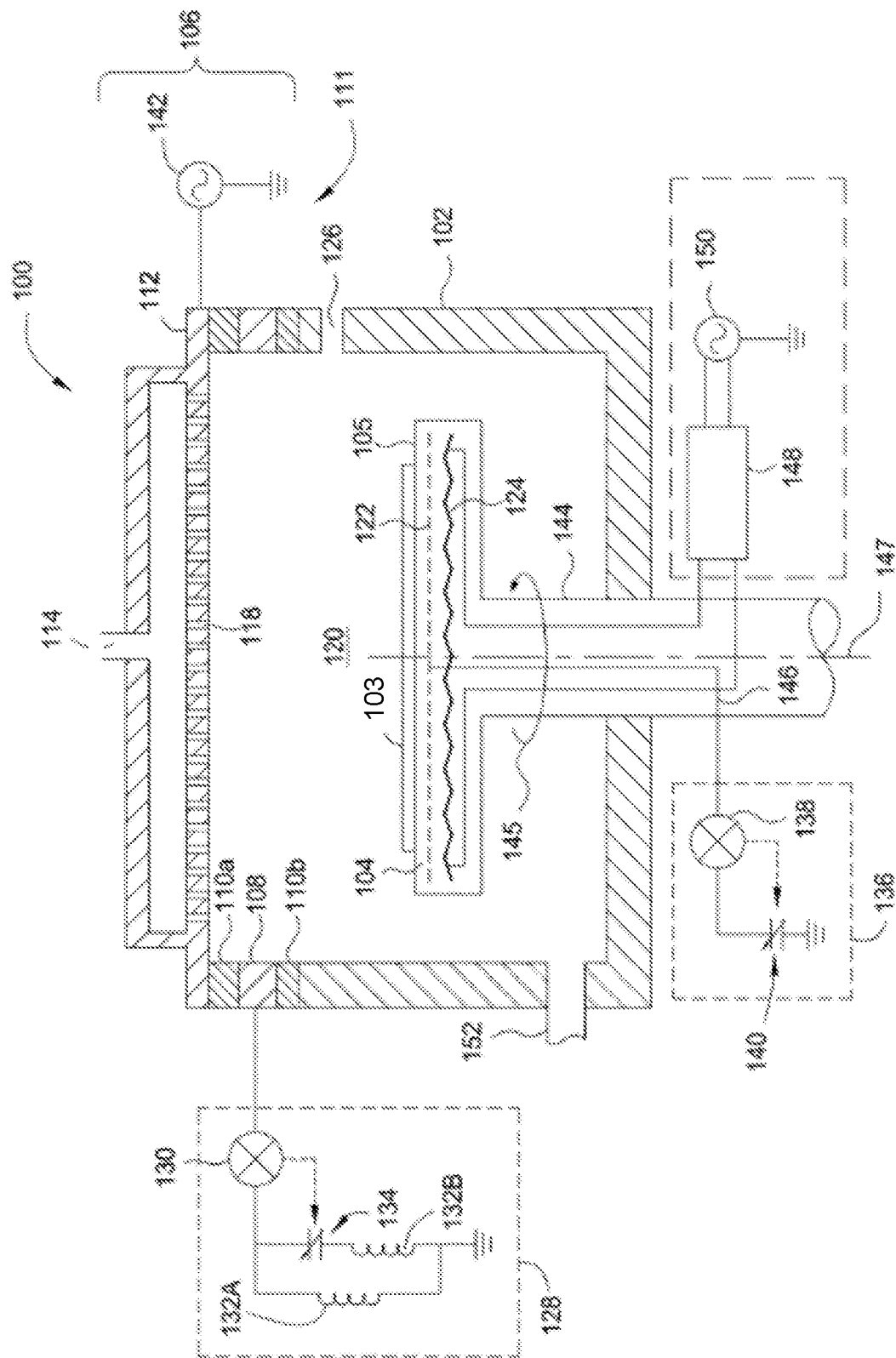
FIG. 1 shows a schematic cross-sectional view of an exemplary processing chamber according to some embodiments of the present technology.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
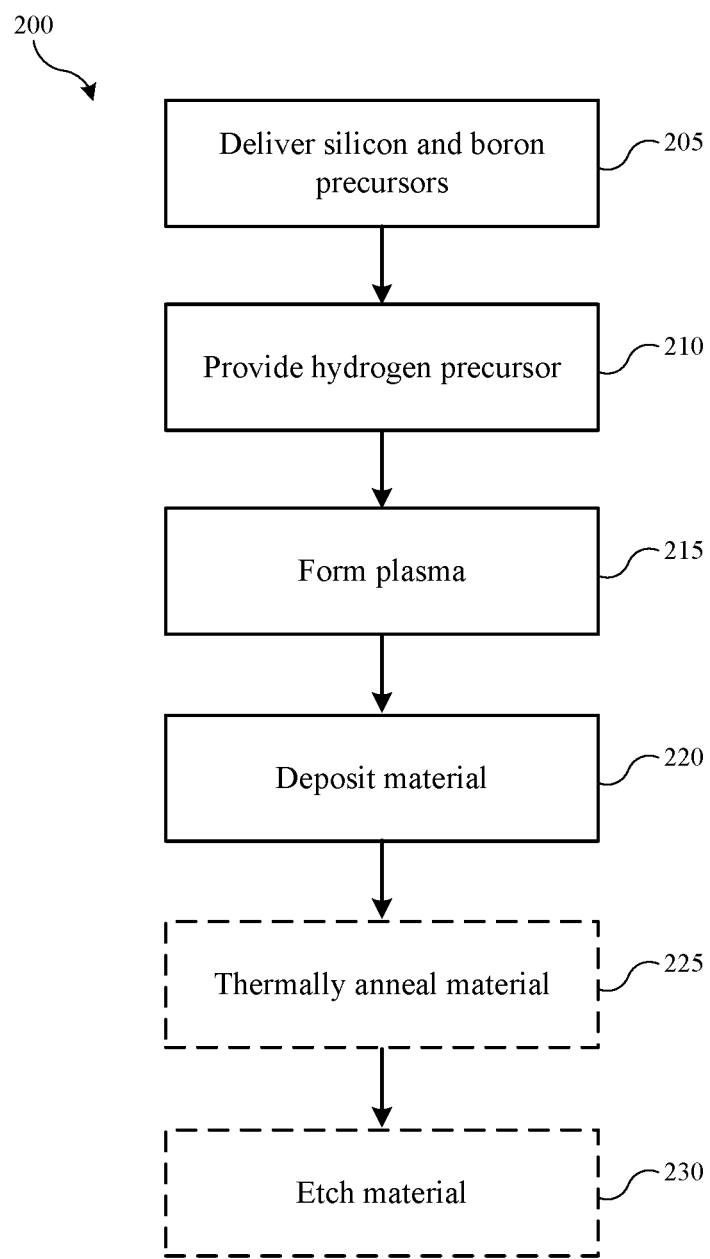
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations shown schematically in FIGS. 3-5B, the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3:
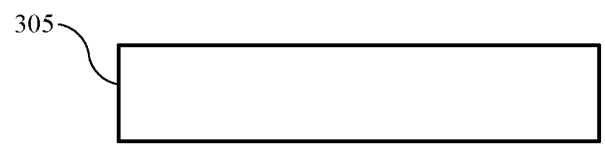
FIG. 3 shows a schematic view of a substrate prior to deposition according to some embodiments of the present technology.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above. An exemplary substrate 305 is illustrated in FIG. 3 prior to initiating deposition.

The substrate 305 may be any number of materials on which materials may be deposited. The substrate may be or include silicon, germanium, dielectric materials including silicon oxide or silicon nitride, metal materials, or any number of combinations of these materials, which may be the substrate 305, or materials formed on substrate 305. In some embodiments optional treatment operations, such as a pretreatment, may be performed to prepare a surface of substrate 305 for deposition. For example, a pretreatment may be performed to provide certain ligand terminations on the surface of the substrate, and which may facilitate nucleation of a film to be deposited. For example, hydrogen, oxygen, carbon, nitrogen, or other molecular terminations, including any combination of these atoms or radicals, such as amidogen or other functional groups, as non-limiting examples, may be adsorbed, reacted, or formed on a surface of substrate 305. Additionally, material removal may be performed, such as reduction of native oxides or etching of material, or any other operation that may prepare one or more exposed surfaces of substrate 305 for deposition.

Figure 4A:
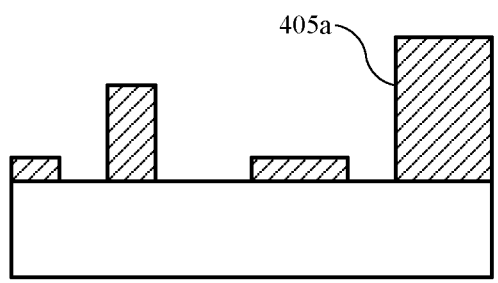
FIGS. 4A-4B show schematic views of exemplary substrates during deposition according to some embodiments of the present technology.

At operation 205, one or more precursors may be delivered to the processing region of the chamber. For example, in exemplary embodiments in which a boron-incorporated silicon film may be formed, a silicon-containing precursor and a boron-containing precursor may be delivered to the processing region of the processing chamber. Plasma enhanced deposition may be performed in some embodiments of the present technology, which may facilitate material reactions and deposition. As noted above, some embodiments of the present technology may encompass formation or deposition of silicon-and-boron materials, which may be characterized conventionally by increased surface roughness, such as in comparison to a thermally produced silicon film, for example. Nucleation of these silicon-and-boron materials may form islands 405a on substrate 305 in some embodiments, such as illustrated in FIG. 4A. These islands may form three-dimensionally to different heights during initial film formation, which may be maintained during film growth.

Some embodiments of the present technology may include additionally providing a hydrogen-containing precursor at operation 210, and which is provided with the silicon-containing precursor and the boron-containing precursor. The precursors delivered may all be used to form a plasma within the processing region of the semiconductor processing chamber at operation 215. At operation 220, a silicon-and-boron material may be deposited on the substrate 305. By incorporating a hydrogen-containing precursor in some embodiments, islands formed during nucleation may be reduced or limited.

Figure 4B:
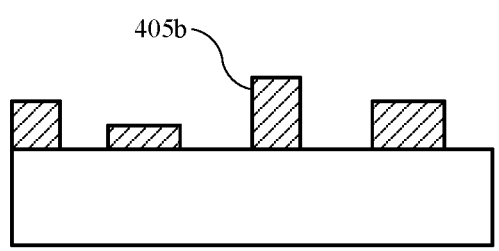

For example, as illustrated in FIG. 4B, islands 405b may form to a lower or lesser extent than islands 405a. By incorporating an additional hydrogen source, a film modification, or profile etch may be performed simultaneously with the deposition of material. For example, through reaction and/or physical interaction with features being formed of the silicon-and-boron material, hydrogen-radicals may trim the island formation while a more uniform profile of formation is being produced. Consequently, the islands may not extend to as great a degree relative to conventional processes. To provide sufficient hydrogen radicals in the process, the hydrogen-containing precursor may be included at a greater flow rate than one or both of the silicon-containing precursor or the boron-containing precursor. For example, in some embodiments a flow rate ratio of the hydrogen-containing precursor to either or both of the silicon-containing precursor and/or the boron-containing precursor may be greater than or about 1:1, and in some embodiments may be greater than or about 2:1, greater than or about 3:1, greater than or about 4:1, greater than or about 5:1, greater than or about 6:1, greater than or about 8:1, greater than or about 10:1, greater than or about 15:1, greater than or about 20:1, greater than or about 25:1, greater than or about 30:1, greater than or about 35:1, greater than or about 40:1, greater than or about 45:1, greater than or about 50:1, or more. As will be explained further below, in some embodiments a further dilution may be performed in which a ratio of hydrogen to silicon and/or boron precursors may be greater than or about 100:1, and may be greater than or about 500:1, greater than or about 1,000:1, greater than or about 1,500:1, greater than or about 2,000:1, greater than or about 2,500:1, or more.

For example, depending on the precursors used, a silicon-containing precursor may be delivered at a flow rate less than or about 500 sccm, and may be delivered at a flow rate less than or about 400 sccm, less than or about 300 sccm, less than or about 200 sccm, less than or about 100 sccm, less than or about 90 sccm, less than or about 80 sccm, less than or about 70 sccm, less than or about 60 sccm, less than or about 50 sccm, or less. Similarly, a boron-containing precursor may be delivered at a flow rate less than or about 1,000 sccm, and may be delivered at a flow rate less than or about 800 sccm, less than or about 600 sccm, less than or about 500 sccm, less than or about 450 sccm, less than or about 400 sccm, less than or about 350 sccm, less than or about 300 sccm, less than or about 250 sccm, less than or about 200 sccm, or less. Any additional ranges within these ranges or as combinations of any stated or unstated number may also be used.

A hydrogen-containing precursor may be delivered at greater than or about 1,000 sccm, and may be delivered at a flow rate of greater than or about 1,200 sccm, greater than or about 1,400 sccm, greater than or about 1,600 sccm, greater than or about 1,800 sccm, greater than or about 2,000 sccm, greater than or about 2,200 sccm, greater than or about 2,400 sccm, greater than or about 2,600 sccm, greater than or about 2,800 sccm, greater than or about 3,000 sccm, or more. Increasing the hydrogen-containing precursor may further smooth the surface of the film being deposited, however, increased hydrogen incorporation may occur within the deposited film. Accordingly, in some embodiments, the hydrogen-containing precursor may be delivered at a flow rate of less than or about 4,000 sccm, and may be delivered at a flow rate of less than or about 3,800 sccm, less than or about 3,600 sccm, less than or about 3,400 sccm, less than or about 3,200 sccm, less than or about 3,000 sccm, less than or about 2,800 sccm, less than or about 2,600 sccm, or less. Additionally, in some embodiments in which higher dilution may be performed, the hydrogen-containing precursor may be delivered at a flow rate of greater than or about 5,000 sccm, and may be delivered at a flow rate of greater than or about 10,000 sccm, greater than or about 15,000 sccm, greater than or about 20,000 sccm, greater than or about 25,000 sccm, or more. In some embodiments, the flow rates of the silicon or boron precursors may be further reduced, such as to less than or about 200 sccm, and may be reduced to less than or about 150 sccm, less than or about 100 sccm, less than or about 50 sccm, less than or about 30 sccm, less than or about 20 sccm, less than or about 10 sccm, or less.

Figure 5A:
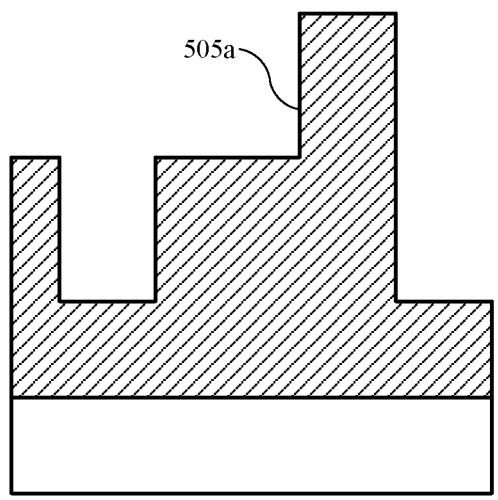
FIGS. 5A-5B show schematic views of exemplary substrates during deposition according to some embodiments of the present technology.

The film may be deposited to any thickness on the substrate 305. Surface roughness of the produced film may not be limited to issues during film nucleation as noted above. For example, film growth and plasma termination may also affect surface roughness in some aspects of the present technology. For example, when sufficient film growth has occurred, the process may be halted by extinguishing the plasma within the processing chamber, such as by halting power to a plasma-generating electrode, for example. Plasma termination may also increase surface roughness by causing an amount of residual ion physical interaction after deposition has completed. Both nucleation effects and plasma termination effects may be estimated to be consistent regardless of thickness of the film formed. However, testing has shown that roughness of the deposited film increases as film thickness increases. Consequently, roughness effects occur during film growth as well, and as film thickness increases, roughness of the film may further increase as well. As illustrated in FIG. 5A, islands 405*a* formed during nucleation may not only be maintained, but may grow or expand during deposition without one or more of the characteristics described throughout the present technology. Hence, a produced film 505*a* may be characterized by increased roughness that may affect uniformity of subsequent etching.

For example, thermally produced silicon, such as polysilicon or other silicon materials, may be characterized by relatively low average roughness, such as less than or about 0.5 nm, or less than or about 0.2 nm. The film may also be characterized by a relatively low roughness range, such as the difference between a highest peak and a lowest peak on the formed film. For example, the roughness range may be less than or about 1.5 nm, or less than or about 1 nm. However, for silicon-and-boron films produced without one or more aspects of the present technology, an average roughness may be greater than or about 2 nm, greater than or about 3 nm, or more, for a similar thickness film, although as noted roughness may increase with increased film thickness. Moreover, the range of roughness of the produced silicon-and-boron material may be greater than or about 10 nm, and may be greater than or about 15 nm, or more, again depending on the film thickness. During subsequent etching operations, these larger disparities across the film may challenge etching operation uniformity, and may require additional operations to be performed, such as an additional chemical-mechanical polishing operation.

Figure 5B:
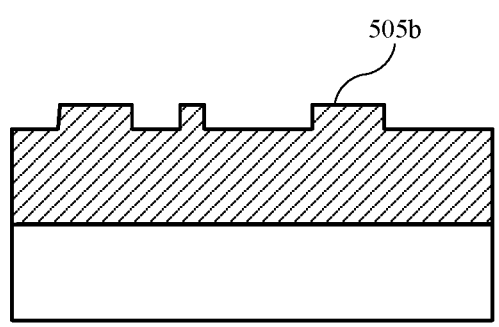

The present technology, however, may reduce or greatly reduce both the average roughness and the range of roughness of produced silicon-and-boron films by performing a substantially simultaneous etch utilizing additional hydrogen-containing precursor, or by performing one or more additional adjustments described further below. As illustrated in FIG. 5B, produced film 505*b* may be characterized by an average roughness of less than or about 2 nm, and may be characterized by an average roughness of less than or about 1.5 nm, less than or about 1.0 nm, less than or about 0.9 nm, less than or about 0.8 nm, less than or about 0.7 nm, less than or about 0.6 nm, less than or about 0.5 nm, less than or about 0.4 nm, less than or about 0.3 nm, less than or about 0.2 nm, or less. Additionally, the roughness may be substantially controlled regardless of film thickness in some embodiments. This may allow avoidance of additional chemical-mechanical polishing operations, as the as-deposited film may be characterized by any of the average roughness ranges illustrated. Additionally, the roughness range across the as-deposited film may be less than or about 10 nm, and may be less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or less. Consequently, improved materials may be produced, which may afford film and mask benefits over conventional materials and processes, as well as potentially reducing fabrication operations by limiting or reducing the number of polishing operations in a sequence.

Any number of precursors may be used with the present technology with regard to the silicon-containing precursor and the boron-containing precursor. For example, the silicon-containing precursor may include any silicon-containing material, such as organosilanes, which may include silane, disilane, and other materials. Additional silicon-containing materials may include silicon, carbon, oxygen, or nitrogen, such as trisilylamine. Boron-containing materials may include boranes, such as borane, diborane, or other multicenter-bonded boron materials, as well as any other boron-containing materials that may be used to produce silicon-and-boron-containing materials. The boron incorporation in the silicon film may be based on any percentage incorporation. For example, the produced film may include greater than or about 5% boron incorporation, and in some embodiments may include greater than or about 10% boron incorporation, greater than or about 15% boron incorporation, greater than or about 20% boron incorporation, greater than or about 25% boron incorporation, greater than or about 30% boron incorporation, greater than or about 35% boron incorporation, greater than or about 40% boron incorporation, greater than or about 45% boron incorporation, greater than or about 50% boron incorporation, greater than or about 55% boron incorporation, greater than or about 60% boron incorporation, greater than or about 65% boron incorporation, greater than or about 70% boron incorporation, greater than or about 75% boron incorporation, greater than or about 80% boron incorporation, greater than or about 85% boron incorporation, greater than or about 90% boron incorporation, greater than or about 95% boron incorporation, or greater.

One or more additional aspects of the deposition may also be tuned to improve aspects of the deposition being performed. For example, the plasma power may impact the extent of hydrogen dissociation. Any number of hydrogen-containing precursors may be used, and in some embodiments diatomic hydrogen may be included. For some silicon-and-boron-containing materials, the materials are sufficiently reactive at deposition temperatures that minimal plasma enhancement may be included. For example, some conventional technologies utilize a plasma power of less than or about 200 Watts. The present technology may utilize higher or much higher plasma power, which may facilitate hydrogen dissociation, and may increase hydrogen radicals, which may reduce roughness as previously explained.

For example, in some embodiments the plasma power may be maintained at greater than or about 1,000 Watts, and may be maintained at greater than or about 1,200 Watts, greater than or about 1,400 Watts, greater than or about 1,600 Watts, greater than or about 1,800 Watts, greater than or about 2,000 Watts, greater than or about 2,200 Watts, greater than or about 2,400 Watts, greater than or about 2,600 Watts, greater than or about 2,800 Watts, greater than or about 3,000 Watts, or higher. This enhanced plasma power may also improve other precursor dissociation and activation, which may increase a deposition rate as well. Consequently, despite a simultaneous etch of the material during deposition, deposition rates of the film may be comparable if not improved over conventional deposition as well. The deposition and simultaneous etch for profile modification may then be maintained continuously or sequentially until a target film thickness has been produced. Depending on the plasma process being performed, a plasma power density may also be maintained, which may allow modulation of frequency and power. For example, in some embodiments plasma power density may be maintained greater than or about 0.25 W/cm$^2$, and may be maintained at greater than or about 0.5 W/cm$^2$, greater than or about 1.0 W/cm$^2$, greater than or about 1.5 W/cm$^2$, greater than or about 2.0 W/cm$^2$, greater than or about 2.5 W/cm$^2$, or higher.

The temperatures of the substrate may additionally impact the deposition. For example, in some embodiments the substrate may be maintained at a temperature of greater than or about 400° C., and may be maintained at a temperature of greater than or about 420° C., greater than or about 440° C., greater than or about 460° C., greater than or about 480° C., greater than or about 500° C., or greater. By performing the deposition according to some embodiments of the present technology, hydrogen etching may be performed during the deposition to reduce roughness of the formed film. However, the amount of hydrogen radicals produced, such as with the enhanced plasma and delivery of hydrogen, may also increase an amount of hydrogen incorporation in the film produced. This may increase a compressive stress within the film. For example, an as-deposited film may be characterized by a compressive stress of greater than or about −800 MPa, which may be based in part on the hydrogen incorporation. Consequently, in some embodiments, method 200 may include operations to reduce hydrogen incorporation in the film.

For example, in some embodiments, method 200 may include thermally annealing the formed silicon-and-boron-containing material at optional operation 225. While the deposition may be performed at a first temperature, the thermal anneal may be performed at a second temperature greater than the first. For example, the thermal anneal may be performed at a temperature greater than or about 480° C., and the thermal anneal may be performed at greater than or about 500° C., greater than or about 510° C., greater than or about 520° C., greater than or about 530° C., greater than or about 540° C., greater than or about 550° C., greater than or about 560° C., greater than or about 570° C., greater than or about 580° C., greater than or about 590° C., greater than or about 600° C., or higher. The thermal anneal may be performed for a period of time that may be greater than or about 0.5 minutes, and may be greater than or about 1 minute, greater than or about 2 minutes, greater than or about 3 minutes, greater than or about 4 minutes, greater than or about 5 minutes, greater than or about 6 minutes, or more.

By performing a thermal anneal, an amount of hydrogen incorporated within the film may be removed, which may relax a compressive stress. For example, in some embodiments, subsequent the thermal anneal, the compressive stress within the film may be maintained at less than or about −700 MPa, and may be less than or about −650 MPa, less than or about −600 MPa, less than or about −550 MPa, less than or about −500 MPa, less than or about −450 MPa, less than or about −400 MPa, less than or about −350 MPa, less than or about −300 MPa, less than or about −250 MPa, less than or about −200 MPa, less than or about −150 MPa, less than or about −100 MPa, or less.

The pressure within the processing region may affect the amount of ionization and physical interaction performed during the deposition. By lowering a processing pressure, increased ion interaction may occur. Accordingly, in some embodiments a processing pressure during the deposition may be maintained at less than or about 50 Torr, and may be maintained at less than or about 40 Torr, less than or about 30 Torr, less than or about 20 Torr, less than or about 15 Torr, less than or about 10 Torr, less than or about 9 Torr, less than or about 8 Torr, less than or about 7 Torr, less than or about 6 Torr, less than or about 5 Torr, less than or about 4 Torr, less than or about 3 Torr, less than or about 2 Torr, or less.

Testing has shown that argon incorporation may increase roughness, and thus limiting or excluding argon may improve film roughness. However, when argon is excluded from the processing precursors, testing has shown that film peeling may increase. Accordingly, in some embodiments argon may be nonetheless included with the silicon-containing precursor and the boron-containing precursor. To limit the effect on roughness, a flow rate ratio of the argon precursor to the hydrogen-containing precursor may be maintained at less than or about 2:1, and may be maintained at less than or about 1:1, less than or about 0.8:1, less than or about 0.7:1, less than or about 0.6:1, less than or about 0.5:1, less than or about 0.4:1, less than or about 0.3:1, less than or about 0.2:1, less than or about 0.1:1, or less.

The combination or further adjustment of processing parameters may also affect and may improve additional aspects of the produced film. Incorporating boron into hardmask films may improve selectivity to a number of films. As film stacks include greater numbers of materials, both related to hardmask opening operations as well as subsequent film etching, providing improved selectivity may further reduce the number of additional operations being performed. Increasing film crystallinity may also increase etch selectivity, however, as film crystallinity increases, conventional technologies have reduced or worsened line-edge roughness and line-width roughness. Consequently, many technologies attempt to maintain the film as amorphous silicon. The present technology may at least partially increase crystallinity of the formed film, which may increase etch selectivity, although by limiting the crystallinity, the present technology may maintain line-edge roughness and line-width roughness.

When increased hydrogen flow rate ratios according to embodiments of the present technology are utilized relative to silicon and boron precursors, crystallinity may be increased. However, by utilizing processing parameters as discussed previously, crystallinity may be maintained below or about 50 Å, and may be maintained below or about 40 Å, below or about 30 Å, below or about 20 Å, below or about 15 Å, below or about 10 Å, below or about 7 Å, below or about 5 Å, below or about 3 Å, or less, although when crystallinity is increased above or about 2 Å or higher, improved etch selectivity may be afforded.

However, as hydrogen inclusion in the plasma increases, so may hydrogen incorporation within the film. This may affect film stress as discussed previously, and may additionally impact other film characteristics. For example, hardmask films may be characterized by extinction coefficients for light at different wavelengths, which may impact lithography operations. Amorphous silicon materials may be characterized by an extinction coefficient at particular parameters of about 0.2, which may allow lithography at film thicknesses of up to about 800 nm based on lower reflectance, which may impact vision through the mask. Silicon and boron films may be characterized by increased extinction coefficients for similar parameters, although as hydrogen incorporation increases, the extinction coefficients may be at least partially reduced. For example, when boron incorporation increases, the extinction coefficient may increase to greater than or about 0.3, greater than or about 0.35, greater than or about 0.4, greater than or about 0.45, or higher.

The effect of higher extinction coefficients for light are that lithography may be challenged, and additional processing may be needed. For example, these increased extinction coefficients may limit lithography visibility to film thicknesses below or about 400 nm, below or about 300 nm, or less. However, by increasing hydrogen incorporation, utilizing increased plasma density, extinction coefficients may be reduced to below or about 0.35, and may be reduced to below or about 0.33, below or about 0.30, below or about 0.28, below or about 0.25, or less. This may allow lithography to extend to thicknesses of greater than or about 400 nm, greater than or about 450 nm, greater than or about 500 nm, or more, without performing additional alignment key opening operations. By increasing temperatures and plasma characteristics, the film structure may be formed to improve characteristics like extinction coefficient and etch selectivity, even with increased hydrogen incorporation. Hydrogen incorporation may also be increased by processing at lower temperatures, such as below 400° C., or below about 350° C., however, the film property differences of such a produced film may cause additional hydrogen outgassing in later processing as previously described. By performing processes at higher temperatures, increased thermal stability may be afforded with the films incorporating increased hydrogen formed as discussed above.

Plasma characteristics may be adjusted both with power and frequency in some embodiments. For example, at lower frequencies, such as below or about 20 MHz, including 13.56 MHz, for example, plasma power of greater than or about 2000 W, or greater than or about 2500 W, may produce the noted film characteristics. It is to be understood, that other plasma characteristics may also be used. For example, by adjusting plasma frequency, plasma power may be adjusted as well. As plasma frequency is increased, such as to above or about 40 MHz, above or about 60 MHz, and even into the microwave frequency range, plasma power may be lowered accordingly, which may improve chamber stability and resilience. FTIR analysis has noted that at these plasma characteristics, peaks related to boron and hydrogen may increase in transmission and shift slightly to higher wavelengths. This may indicate an improved stability of the structure, which may afford increased thermal stability of the film during later processing. Consequently, by increasing crystallinity in some embodiments, lower extinction coefficients and improved thermal stability may also be afforded. By performing deposition according to embodiments of the present technology, reduced roughness of silicon-and-boron-containing films may be afforded, which may improve hardmask effectiveness. During subsequent etching at optional operation 230, a critical dimension of the etch may be maintained more uniform with the present technology than when the present technology is not implemented. By reducing surface roughness, improved etching and structural development may be afforded.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
   delivering a silicon-containing precursor and a boron-containing precursor to a processing region of a semiconductor processing chamber;
   providing a hydrogen-containing precursor with the silicon-containing precursor and the boron-containing precursor, wherein a flow rate ratio of the hydrogen-containing precursor to either of the silicon-containing precursor or the boron-containing precursor is greater than or about 2:1;
   forming a plasma of the silicon-containing precursor, the boron-containing precursor, and the hydrogen-containing precursor within the processing region of the semiconductor processing chamber; and
   depositing a silicon-and-boron material on a substrate disposed within the processing region of the semiconductor processing chamber.

2. The deposition method of claim 1, wherein the silicon-and-boron material is characterized by an as-deposited surface roughness of less than or about 2 nm.

3. The deposition method of claim 1, wherein a plasma power density is maintained at greater than or about 0.5 W/cm$^2$ during the forming the plasma of the silicon-containing precursor, the boron-containing precursor, and the hydrogen-containing precursor within the processing region of the semiconductor processing chamber.

4. The deposition method of claim 1, wherein a substrate temperature is maintained above or about 460° C. during the depositing the silicon-and-boron material on the substrate.

5. The deposition method of claim 1, wherein a pressure is maintained below or about 10 Torr during the depositing the silicon-and-boron material on the substrate.

6. The deposition method of claim 1, further comprising:
   providing an argon precursor with the silicon-containing precursor and the boron-containing precursor.

7. The deposition method of claim 1, further comprising:
   subsequent the depositing, performing a thermal anneal of the silicon-and-boron material.

8. The deposition method of claim 1, wherein the silicon-containing precursor comprises silane, and wherein the boron-containing precursor comprises diborane.

9. A deposition method comprising:
   delivering a silicon-containing precursor and a boron-containing precursor to a processing region of a semiconductor processing chamber;
   forming a plasma of the silicon-containing precursor and the boron-containing precursor within the processing region of the semiconductor processing chamber; and
   depositing a silicon-and-boron material on a substrate disposed within the processing region of the semiconductor processing chamber, wherein the silicon-and-boron material is characterized by an as-deposited surface roughness of less than or about 1.5 nm.

10. The deposition method of claim 9, further comprising:
    providing a hydrogen-containing precursor with the silicon-containing precursor and the boron-containing precursor, wherein a flow rate ratio of the hydrogen-containing precursor to either of the silicon-containing precursor or the boron-containing precursor is greater than or about 2:1.

11. The deposition method of claim 10, further comprising:
    providing an argon precursor with the silicon-containing precursor and the boron-containing precursor, wherein a flow rate ratio of the argon precursor to the hydrogen-containing precursor is less than or about 1:1.

12. The deposition method of claim 9, further comprising:
    subsequent the depositing, thermally annealing the silicon-and-boron material for a first period of time.

13. The deposition method of claim 12, wherein the substrate is maintained at a first temperature during the depositing, wherein the substrate is maintained at a second temperature while thermally annealing the silicon-and-boron material, and wherein the second temperature is greater than the first temperature.

14. The deposition method of claim 13, wherein the second temperature is greater than or about 500° C.

15. The deposition method of claim 9, wherein a plasma power is maintained at greater than or about 2.0 kW during the forming the plasma of the silicon-containing precursor and the boron-containing precursor within the processing region of the semiconductor processing chamber.

16. A deposition method comprising:
    delivering a silicon-containing precursor and a boron-containing precursor to a processing region of a semiconductor processing chamber;
    forming a plasma of the silicon-containing precursor and the boron-containing precursor within the processing region of the semiconductor processing chamber, wherein a plasma power is maintained at greater than or about 1.0 kW during the forming the plasma of the silicon-containing precursor and the boron-containing precursor within the processing region of the semiconductor processing chamber; and
    depositing a silicon-and-boron material on a substrate disposed within the processing region of the semiconductor processing chamber.

17. The deposition method of claim 16, further comprising:
    providing a hydrogen-containing precursor with the silicon-containing precursor and the boron-containing precursor, wherein a flow rate ratio of the hydrogen-containing precursor to either of the silicon-containing precursor or the boron-containing precursor is greater than or about 2:1.

18. The deposition method of claim 17, further comprising:
    providing an argon precursor with the silicon-containing precursor and the boron-containing precursor, wherein a flow rate ratio of the argon precursor to the hydrogen-containing precursor is less than or about 1:1.

19. The deposition method claim 16, further comprising:
    subsequent the depositing, performing a thermal anneal of the silicon-and-boron material for a first period of time.

20. The deposition method of claim 19, wherein the substrate is maintained at a first temperature during the depositing, wherein the substrate is maintained at a second temperature during the thermal anneal of the silicon-and-boron material, and wherein the second temperature is greater than the first temperature.

* * * * *